(12) United States Patent
Sonoda et al.

(10) Patent No.: US 10,228,492 B2
(45) Date of Patent: Mar. 12, 2019

(54) ANTIREFLECTION FILM AND OPTICAL MEMBER INCLUDING ANTIREFLECTION FILM

(71) Applicant: FUJIFILM Corporation, Tokyo (JP)

(72) Inventors: Shinichiro Sonoda, Ashigarakami-gun (JP); Tatsuya Yoshihiro, Ashigarakami-gun (JP); Hiroki Takahashi, Ashigarakami-gun (JP); Mototaka Kanaya, Sano (JP)

(73) Assignee: FUJIFILM Corporation, Tokyo (JP)

(*) Notice: Subject to any disclaimer, the term of this patent is extended or adjusted under 35 U.S.C. 154(b) by 52 days.

(21) Appl. No.: 15/440,195

(22) Filed: Feb. 23, 2017

(65) Prior Publication Data

US 2017/0160438 A1 Jun. 8, 2017

Related U.S. Application Data

(63) Continuation of application No. PCT/JP2015/004053, filed on Aug. 14, 2015.

(30) Foreign Application Priority Data

Aug. 25, 2014 (JP) .................................. 2014-170617

(51) Int. Cl.
*G02B 1/118* (2015.01)
*B32B 7/02* (2019.01)
(Continued)

(52) U.S. Cl.
CPC ................ *G02B 1/118* (2013.01); *B32B 3/30* (2013.01); *B32B 7/02* (2013.01); *B32B 9/00* (2013.01);
(Continued)

(58) Field of Classification Search
CPC ... G02B 1/00; G02B 1/02; G02B 1/10; G02B 1/11; G02B 1/111; G02B 1/113; G02B 1/118; G02B 1/14
(Continued)

(56) References Cited

U.S. PATENT DOCUMENTS

| | | | | |
|---|---|---|---|---|
| 6,586,101 B2* | 7/2003 | Chu | ........................ | G02B 1/116 428/432 |
| 2006/0199040 A1* | 9/2006 | Yamada | ................... | C03C 1/006 428/701 |

(Continued)

FOREIGN PATENT DOCUMENTS

CN  103443662 A  12/2013
JP  64-080904 A  3/1989
(Continued)

OTHER PUBLICATIONS

International Search Report (PCT/ISA/210) issued in PCT/JP2015/004053, dated Dec. 22, 2015.
(Continued)

*Primary Examiner* — Robert E Tallman
(74) *Attorney, Agent, or Firm* — Birch, Stewart, Kolasch & Birch, LLP

(57) ABSTRACT

The antireflection film is provided on a surface of a light-transmitting substrate and includes a thin multi-layer film and a fine unevenness layer that are laminated in this order from the substrate side. The thin multi-layer film includes multiple layers. The fine unevenness layer has a structure in which an uneven structure having a shorter average pitch than a wavelength of used light is provided and in which a refractive index to the used light changes continuously depending on a continuous change in a space occupation of the uneven structure in a thickness direction of the thin multi-layer film. The multiple layers include: an oxide film having a relatively high refractive index that is formed of at
(Continued)

least two metal elements or is formed of silicon and at least one metal element; and an oxynitride film having a relatively low refractive index.

9 Claims, 6 Drawing Sheets

(51) Int. Cl.
| | |
|---|---|
| B32B 9/00 | (2006.01) |
| B32B 3/30 | (2006.01) |
| G02B 1/115 | (2015.01) |
| C23C 14/06 | (2006.01) |
| C23C 14/08 | (2006.01) |
| C23C 14/34 | (2006.01) |
| G02B 27/00 | (2006.01) |
| C03C 17/34 | (2006.01) |
| C23C 14/00 | (2006.01) |
| C23C 14/58 | (2006.01) |

(52) U.S. Cl.
CPC ...... *C03C 17/3435* (2013.01); *C23C 14/0036* (2013.01); *C23C 14/0676* (2013.01); *C23C 14/08* (2013.01); *C23C 14/083* (2013.01); *C23C 14/34* (2013.01); *C23C 14/3464* (2013.01); *C23C 14/58* (2013.01); *G02B 1/115* (2013.01); *G02B 27/0018* (2013.01); *C03C 2217/734* (2013.01)

(58) Field of Classification Search
USPC .......................................... 359/359, 360, 361
See application file for complete search history.

(56) References Cited

U.S. PATENT DOCUMENTS

| | | |
|---|---|---|
| 2014/0016204 A1 | 1/2014 | Hakuta et al. |
| 2015/0219798 A1 | 8/2015 | Sonoda et al. |
| 2015/0219799 A1 | 8/2015 | Sonoda et al. |

FOREIGN PATENT DOCUMENTS

| | | |
|---|---|---|
| JP | 2000-160331 A | 6/2000 |
| JP | 2014-021146 A | 2/2014 |
| JP | 2014-081522 A | 5/2014 |
| JP | 2014-098885 A | 5/2014 |

OTHER PUBLICATIONS

Serényi et al., "Refractive index of sputtered silicon oxynitride layers for antireflection coating", Vacuum, vol. 61, 2001, pp. 245-249.

Written Opinion (PCT/ISA/237) issued in PCT/JP2015/004053, dated Dec. 22, 2015.

Chinese Office Action and Search Report, dated Dec. 25, 2017, for corresponding Chinese Application No. 201580045227.0, with an English machine translation of the Chinese Office Action.

Japanese Notification of Reasons for Refusal, dated Jan. 23, 2018, for corresponding Japanese Application No. 2016-544931, with an English machine translation.

Chinese Office Action, dated Jul. 5, 2018, for Chinese Application No. 201580045227.0, with an English machine translation.

\* cited by examiner

ANTIREFLECTION FILM AND OPTICAL MEMBER INCLUDING ANTIREFLECTION FILM

CROSS REFERENCE TO RELATED APPLICATIONS

The present application is a Continuation of PCT International Application No. PCT/JP2015/004053 filed on Aug. 14, 2015, which claims priority under 35 U.S.C. § 119(a) to Japanese Patent Application No. 2014-170617 filed on Aug. 25, 2014. Each of the above applications is hereby expressly incorporated by reference, in its entirety, into the present application.

BACKGROUND OF THE INVENTION

1. Field of the Invention

The present invention relates to an antireflection film and an optical member including an antireflection film.

2. Description of the Related Art

In a lens (transparent substrate) formed of a light-transmitting member such as a plastic, an antireflection film is provided on a light incident surface in order to reduce loss of transmitted light caused by surface reflection.

For example, as an antireflection film to visible light or infrared light, for example, a dielectric multi-layer film or a fine unevenness layer having a surface on which a fine unevenness structure having a shorter pitch than a wavelength of target light is provided is known.

An object of JP2014-21146A is to provide an optical film which can be applied to optical members having various surface shapes and has excellent performance such as wavelength range properties and incidence angle properties, and JP2014-21146A discloses an optical film in which a fine unevenness layer as a second layer is formed over a transparent substrate with a thin layer as a first layer interposed therebetween. In the optical film described in JP2014-21146A, the first layer includes a region in which the refractive index changes continuously or stepwise depending on a change in a composition ratio of a refractive index material in a thickness direction, and specific examples thereof include a film which is formed using a two-source deposition method of titania and silica and a film which is formed using a two-source deposition method of zirconia and silica.

As in JP2014-21146A, JP2014-81522A discloses a configuration in which a fine unevenness layer is formed over a transparent substrate with a transparent thin film interposed therebetween, and discloses an antireflection film which can be manufactured with reduced kinds of materials and is configured to improve productivity. In JP2014-81522A, the transparent thin film includes multiple layers including the same kind of nitride layers and/or oxynitride layers, and examples of the nitride layers include SiN, AlN, and SiAlN, and examples of the oxynitride layers include SiON, AlON, and SiAlON.

SUMMARY OF THE INVENTION

However, in a case where an optical member including an antireflection film, in which a fine unevenness layer is formed over a transparent substrate with a thin layer interposed therebetween as described in JP2014-21146A and JP2014-81522A, is incorporated into a camera as a camera lens, a large amount of ghosting may occur depending on the optical member.

As a result of thorough investigation, the present inventors found that ghosting may be small or large depending on production lots, and also found that this variation in ghosting properties is caused by a variation in the reflectance of an antireflection film depending on production lots. In a case where whether or not a film having desired antireflection performance can be formed is determined depending on production lots, optical members manufactured in a production lot where films having desired performance cannot be formed become defective, which may lead to a decrease in yield.

Therefore, it is desired to form an antireflection film in which a variation in reflectance depending on production lots is reduced and which has constant antireflection performance.

The present invention has been made in consideration of the above-described circumstances, and an object thereof is to provide an antireflection film and an optical member, the antireflection film having a configuration in which an antireflection film having constant antireflection performance and an optical member including the antireflection film can be manufactured in a high yield.

The present inventors found that, in an antireflection film in which a fine unevenness layer is formed over a transparent substrate with a thin layer interposed therebetween, the performance of an antireflection film varies depending on production lots because, in a case where a film having a high refractive index is formed by using an oxynitride film as the thin layer, a difference between a designed refractive index value of the film and a refractive index of the actually formed film varies significantly depending production lots. In addition, the present inventors newly found that the extinction coefficient of the oxynitride film increases rapidly on a high refractive index side.

The present invention has been made based on the above-described findings newly found by the present inventors.

According to the present invention, there is provided an antireflection film which is provided on a surface of a light-transmitting substrate, the antireflection film comprising a thin multi-layer film and a fine unevenness layer that are laminated in this order from the substrate side, wherein the thin multi-layer film includes multiple layers, the fine unevenness layer has a structure in which an uneven structure having a shorter average pitch than a wavelength of used light is provided on a surface and in which a refractive index to the used light changes continuously depending on a continuous change in a space occupation of the uneven structure in a thickness direction of the thin multi-layer film, the multiple layers include a layer having a relatively high refractive index and a layer having a relatively low refractive index, the layer having a relatively high refractive index is formed of an oxide film of at least two metal elements or an oxide film of silicon and at least one metal element, and the layer having a relatively low refractive index is formed of an oxynitride film.

Here, the relatively high refractive index and the relatively low refractive index refer to a low refractive index and a high refractive index in a case where the two refractive indices are compared to each other.

In addition, the oxide film of at least two metal elements is a film including only oxygen in addition to the metal elements. The oxide film of silicon and at least one metal element is a film including only oxygen in addition to the silicon and the metal element. The oxynitride film is a film including both oxygen and nitrogen.

It is preferable that, in the thin multi-layer film, a layer having a refractive index which is higher than or equal to a refractive index n is formed of the oxide film of at least two metal elements or the oxide film of silicon and at least one metal element, and a layer having a refractive index which is lower than the refractive index n is formed of the oxynitride film. Here, the refractive index n satisfies 1.58≤n≤1.66 and preferably is 1.61.

In the present invention, it is preferable that the layer having a relatively low refractive index is a silicon oxynitride film.

In the present invention, it is preferable that the layer having a relatively high refractive index is a niobium-silicon oxide film.

According to the present invention, there is provided an optical member comprising the above-described antireflection film on a surface of a light-transmitting substrate.

In the antireflection film according to the present invention, an oxynitride film with which it is difficult to stably obtain a layer having a high refractive index is provided as a layer having a relatively low refractive index, and an oxide film of at least two metal elements or an oxide film of silicon and at least one metal element with which a layer having a high refractive index can be stably obtained is provided as a layer having a relatively high refractive index. Therefore, the antireflection film has no variation depending on production lots and can have stable antireflection performance.

DESCRIPTION OF THE PREFERRED EMBODIMENTS

Hereinafter, an embodiment of the present invention will be described with reference to the drawings.

Figure 1:
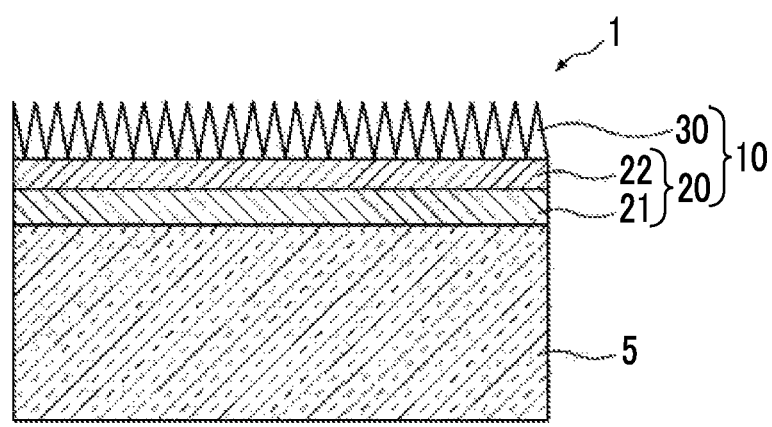
FIG. 1 is a schematic cross-sectional view showing a configuration of an antireflection film according to an embodiment of the present invention and an optical member including the antireflection film.

FIG. 1 is a schematic cross-sectional view showing a configuration of an optical member 1 including an antireflection film 10 according to an embodiment of the present invention. As shown in FIG. 1, the antireflection film 10 includes a thin multi-layer film 20 and a fine unevenness layer 30 that are laminated in this order on a surface of a transparent substrate 5. The thin multi-layer film 20 include multiple layers. The fine unevenness layer 30 has a structure in which an uneven structure having a shorter average pitch than a wavelength of used light is provided on a surface and in which a refractive index to the used light changes continuously depending on a continuous change in a space occupation of the uneven structure in a thickness direction of the thin multi-layer film.

The thin multi-layer film 20 includes a layer 21 having a relatively high refractive index and a layer 22 having a relatively low refractive index, the layer 21 having a relatively high refractive index is formed of an oxide film of at least two metal elements or an oxide film of silicon and at least one metal element, and the layer 22 having a relatively low refractive index is formed of an oxynitride film.

The layer 21 having a relatively high refractive index (hereinafter, referred to as "oxide film 21") and the layer 22 having a relatively low refractive index (hereinafter, referred to as "oxynitride film 22") are not particularly limited as long as the refractive index of the oxide film 21 is higher than that of the oxynitride film 22. In particular, it is preferable that a layer having a refractive index which is higher than or equal to a refractive index n is formed of the oxide film 21 and a layer having a refractive index which is lower than the refractive index n is formed of the oxynitride film 22. Here, 1.585≤n≤1.66, it is preferable that 1.60≤n≤1.63, and it is most preferable that n=1.61.

As the oxynitride film 22, a film formed of silicon oxynitride (SiON) is preferable. The refractive index of SiON can be changed by changing a ratio between Si, O, and N.

Examples of the oxide film 21 of at least two metal elements or the oxide film 21 of silicon (Si) and at least one metal element include an oxide film formed of silicon niobium oxide (SiNbO), niobium-aluminum oxide (NbAlO), titanium-aluminum oxide (TiAlO), silicon-titanium oxide (SiTiO), zirconium-silicon oxide (ZrSiO), zirconium-aluminum oxide (ZrAlO), tantalum-silicon oxide (TaSiO), or the like. These oxides films are formed of three elements including two metal elements and oxygen or three elements including Si, one metal element, and oxygen. The refractive index of each of the oxide films can be changed by changing a ratio between the three elements. In a case where the oxide film includes three or more metal elements and Si, the oxide film may include two or more metal elements. However, from the viewpoint of reducing the kinds of materials and easily controlling the refractive index, it is preferable that the oxide film is formed of three elements including oxygen.

In order to reduce the amount of a metal target, which is set in a chamber of a sputtering device, and reduce the number of film forming batches, it is preferable that either an element which is oxynitrided in an oxynitride constituting the oxynitride film or an element which is oxidized in an oxide constituting the oxide film is used in common. For example, in a case where the oxynitride is SiON, it is preferable that the oxide is SiNbO, SiTiO, ZrSiO, or TaSiO.

The oxide film 21 can be formed using a co-sputtering method. For example, in a case where a SiNbO film is formed, sputtering is performed by causing Ar and $O_2$ to flow at a predetermined flow rate in a chamber including a Si target and an Nb target. By changing a sputtering power during the sputtering, the film forming rate can be changed, and by changing the film forming rate, films having different ratios between Si, Nb, and O can be formed.

The substrate 5 is not particularly limited as long as it has light-transmitting properties to used light, and can be configured as, for example, a transparent lens or a transparent resin. The used light differs depending on the optical element to which the antireflection film of the present disclosure is applied. In the case that the intended use is for a lens of an infrared surveillance for crime prevention, the used light is infrared light. In this case, the wavelength of the used light is within an approximate range from 700 nm to 3000 nm. In addition, in the case that the intended use is for an optical element for optical communication, the wavelength of the used light is within an approximate range from 800 nm to 1800 nm. In the case that the intended use is for a lens of a general digital camera, the used light is visible light. In this case, the wavelength of the used light is within an approximate range from 380 nm to 780 nm. The shape of the substrate 5 is not particularly limited as long as the substrate 5 can be used in an optical device, and may be a flat plate, a concave lens, or a convex lens. FIG. 1 shows an example in which an antireflection film is formed on plane using the flat substrate 5. However, the antireflection film according to the present invention can be preferably used even on a curved surface such as a concave surface of a plano-concave lens.

The fine unevenness layer 30 is formed of, for example, a layer including an alumina hydrate as a major component. Examples of the alumina hydrate include boehmite (represented by $Al_2O_3 \cdot H_2O$ or AlOOH) which is alumina monohydrate, and bayerite (represented by $Al_2O_3 \cdot 3H_2O$ or $Al(OH)_3$) which is alumina trihydrate (aluminum hydroxide).

The layer including an alumina hydrate as a major component can be obtained, for example, by forming an aluminum film using a sputtering method, a vapor deposition method, or the like and then performing a hydrothermal treatment on the aluminum film.

The fine unevenness layer 30 including an alumina hydrate as a major component is transparent and has a substantially sawtooth-shaped cross-section although sizes (vertical angles) and orientations of saw teeth vary (refer to FIG. 1). Pitches of the fine unevenness layer 30 are distances between most adjacent convex portions which separate concave portions from each other, and are several tens of nanometers to several hundreds of nanometers. The average pitch of the fine unevenness layer in the antireflection film o the present disclosure needs only to be shorter than the wavelength of used light, and therefore the allowable range of the average pitch differs according to the wavelength of used light. In the case that the used light is infrared light, the average pitch needs only to be shorter than 700 nm, and preferably 500 nm or shorter. In the case that the used light is that which is applied to optical communication, the average pitch needs only to be shorter than 800 nm, and preferably 500 nm or shorter. In the case that the used light is visible light, the average pitch needs only to be shorter than 380 nm. The wavelength of the used light is determined according to the intended use. It is more preferable for the average pitch to be 200 nm or shorter, in order to be able to be compatible with the wavelengths of various types of used light.

The average pitch of the fine unevenness layer 30 can be obtained by obtaining a surface image of a fine uneven structure using a scanning electron microscope (SEM), processing the surface image to binarize image data, and performing a statistical procedure.

As the distance from the substrate 5 increases, the density of the fine unevenness layer 30 decreases (the widths of pores corresponding to the concave portions increase, and the widths of the convex portions decrease). That is, the fine unevenness layer 30 has a structure in which, as the distance from the substrate 5 increases, the space occupation decreases. As the space occupation decreases, the refractive index decreases.

Figure 2:
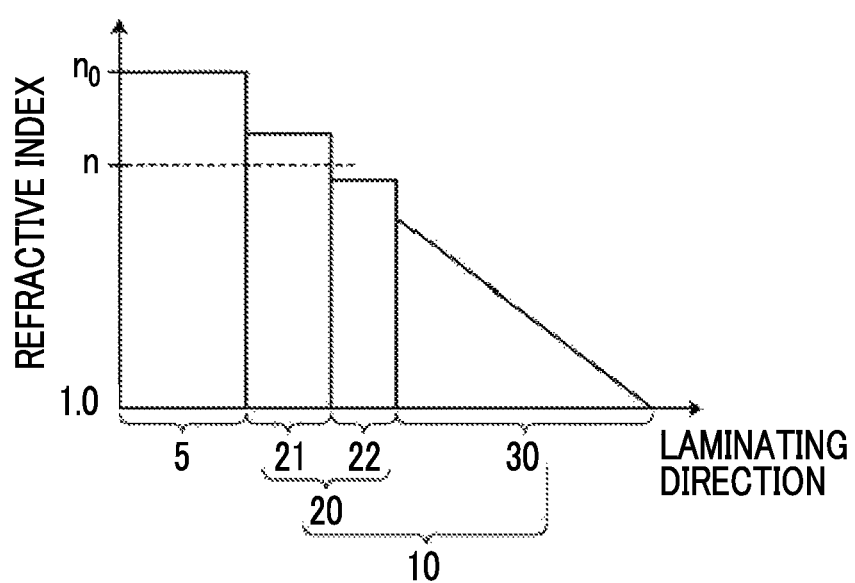
FIG. 2 is a diagram schematically showing a refractive index of the antireflection film of FIG. 1 in a laminating direction.

FIG. 2 is a diagram schematically showing a refractive index of the antireflection film 10 of the optical member 1 shown in FIG. 1 in a laminating direction. The refractive index of the substrate 5 is $n_0$, and the refractive index of air is 1. In addition, in the fine unevenness layer 30, the refractive index changes so as to gradually become closer to 1, which is the refractive index of air, in a direction from the surface side to the substrate 5 side.

The thin multi-layer film 20 includes the oxide film 21 having a refractive index which is higher than the refractive index n and the oxynitride film 22 having a refractive index which is lower than the refractive index n, in which the oxide film 21 having a high refractive index is formed on the substrate side, and the oxynitride film 22 having a low refractive index is formed on the fine unevenness layer 30 side.

In this example, in the thin multi-layer film 20, the oxide film 21 having a relatively high refractive index and the oxynitride film 22 having a relatively low refractive index are laminated in this order from the substrate 5 side, but the configuration of the thin multi-layer film 20 is not limited thereto. The thin multi-layer film 20 may include three or more layers, and the layer having a high refractive index is not necessarily provided on the substrate side.

Figure 3:
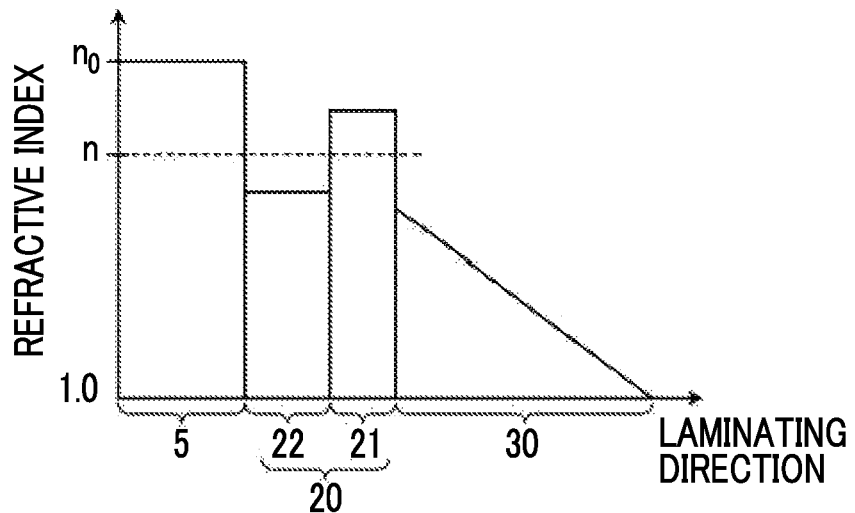
FIG. 3 is a diagram schematically showing a refractive index of an antireflection film according to Design Modification Example 1 in a laminating direction.
Figure 4:
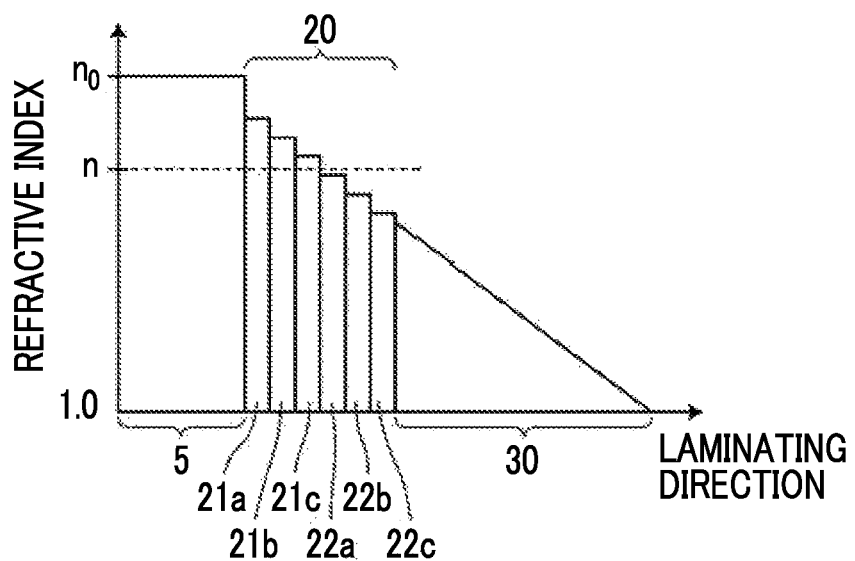
FIG. 4 is a diagram schematically showing a refractive index of an antireflection film according to Design Modification Example 2 in a laminating direction.

FIGS. 3 and 4 are diagrams schematically showing refractive indices of antireflection films according to Design Modification Examples and 1 and 2 in a laminating direction.

In Design Modification Example 1 shown in FIG. 3, as in the embodiment shown in FIG. 2, the thin multi-layer film 20 includes the oxide film 21 having a refractive index which is higher than the refractive index n and the oxynitride film 22 having a refractive index which is lower than the refractive index n. However, FIG. 3 is different from the FIG. 2, in that the oxynitride film 22 having a low refractive index is provided on the substrate 5 side, and the oxide film 21 having a high refractive index is provided on the fine unevenness layer 30 side.

In Design Modification Example 2 shown in FIG. 4, the thin multi-layer film 20 includes oxide films 21a, 21b, and 21c having a refractive index which is higher than the refractive index n and oxynitride films 22a, 22b, and 22c having a refractive index which is lower than the refractive index n, in which the oxide films 21a to 21c and the oxynitride films 22a to 22c are laminated such that the refractive index gradually decreases in a direction from the substrate 5 side to the fine unevenness layer 30 side.

As shown in Design Modification Example 2, the thin multi-layer film 20 may include plural oxide films and plural oxynitride films. Here, in this example, three oxide films and three oxynitride films are provided. However, the number of oxide films may be different from the number of oxynitride films.

In the present invention, it is preferable that the thin multi-layer film 20 has an average refractive index in a range of the refractive index of the substrate 5 to the refractive index of a portion of the fine unevenness layer 30 closest to the substrate 5 side. However, the plural layers constituting the thin multi-layer film 20 are not necessarily disposed in order from the highest to the lowest refractive index.

In addition, the thin multi-layer film 20 may include a layer in addition to the oxide film having a relatively high refractive index and the oxynitride film having a relatively low refractive index. For example, in a case where a SiON film is provided as the oxynitride film having a relatively low refractive index, a $SiO_2$ film may be further provided as a layer having a low refractive index.

Regarding SiON which is particularly preferable as the oxynitride film, it is known that a refractive index in a range of 1.46 to 1.9 can be obtained by changing a ratio between Si, O, and N which are constituent elements of SiON.

However, as described above, the present inventors found that, in a case where a SiON film is formed using a sputtering method, there is a variation between a designed refractive index and a refractive index of the actually formed film, and this variation increases rapidly near a designed refractive index of 1.6. A test in which the fact that the SiON film has a large variation in refractive index on the high refractive index side was found will be described.

[Test 1]

SiON films having various refractive indices were formed on a Si substrate using a sputtering method.

In a sputtering device, a Si target was used, the radio frequency (RF) power was fixed to 500 W, the Ar flow rate was fixed to 26 sccm (ml/min), and the $N_2$ flow rate was fixed to 15 sccm. In this state, by changing the $O_2$ flow rate, plural SiON films having different Si:O:N ratios, that is, different refractive indices were formed. In general, regarding an oxynitride, as the nitrogen (N) content increases, the refractive index increases. The thicknesses of the formed SiON films were in a range of 80 nm to 120 nm.

Figure 5:
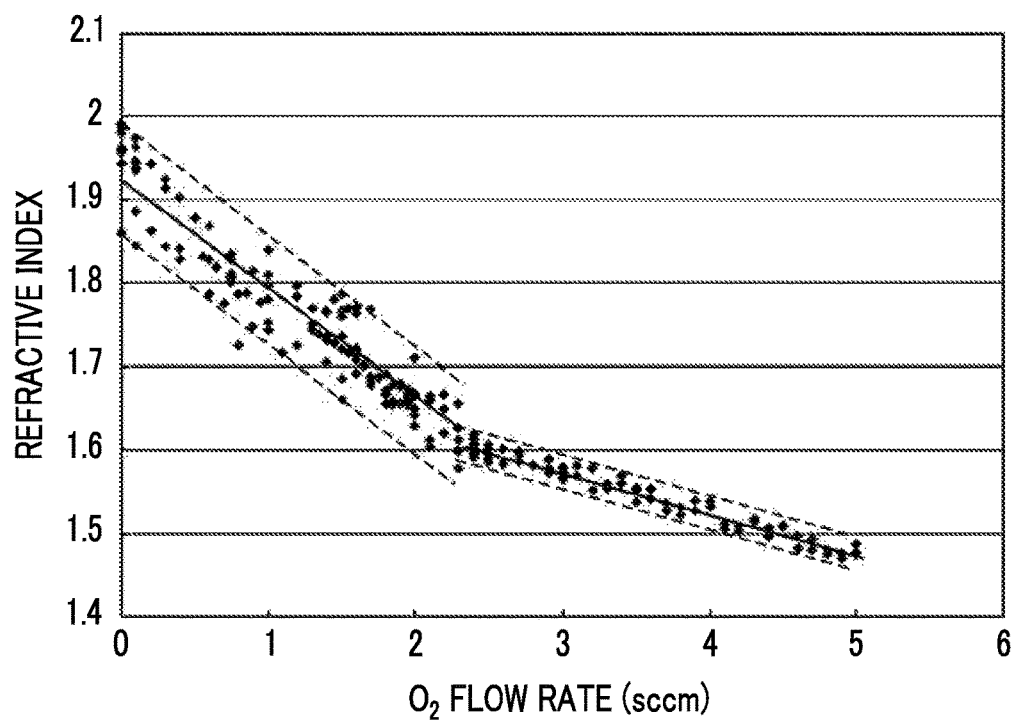
FIG. 5 is a diagram showing the dependence of the refractive index of a silicon oxynitride film, which is formed by sputtering, on an oxygen flow rate.
Figure 6:
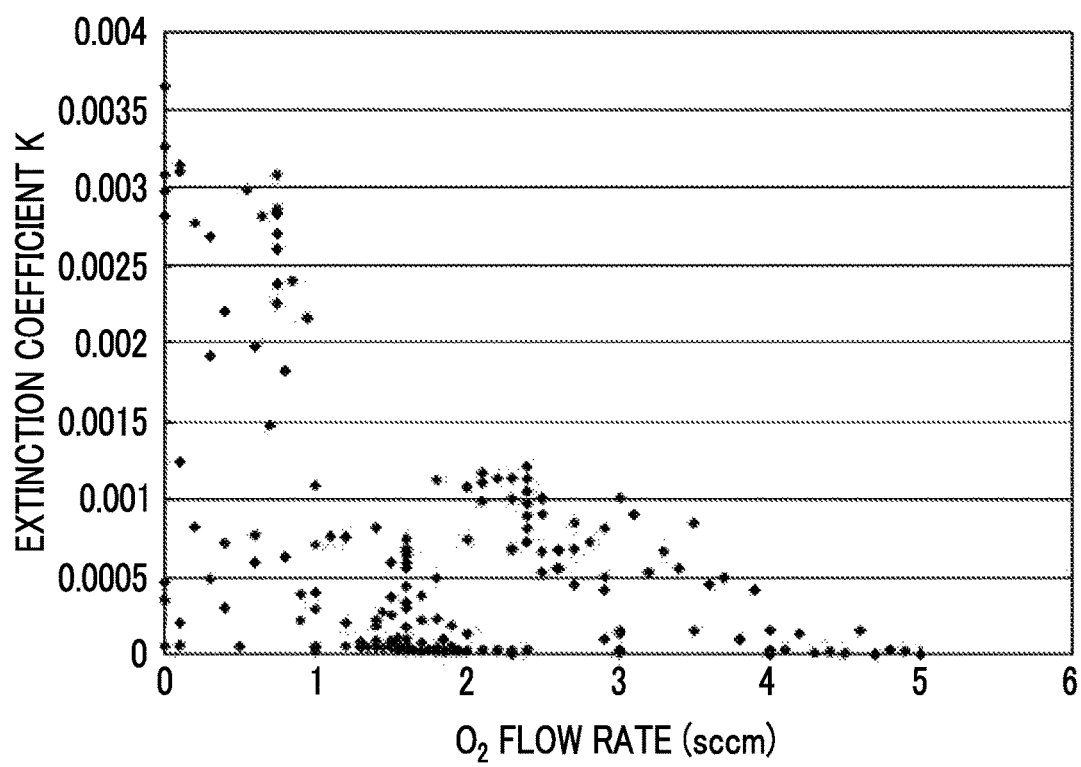
FIG. 6 is a diagram showing the dependence of the extinction coefficient of a silicon oxynitride film, which is formed by sputtering, on an oxygen flow rate.

Regarding the plural SiON films having different refractive indices formed as described above, a relationship between the oxygen flow rate during the film formation and the refractive index of the formed film is shown in FIG. 5, and a relationship between the oxygen flow rate during the film formation and the extinction coefficient of the formed film is shown in FIG. 6. Regarding each of the formed SiON films, the dependence of the refractive index n and the extinction coefficient k on a wavelength was measured by spectroscopic ellipsometry. FIGS. 5 and 6 show values of the refractive index and values of the extinction coefficient at a wavelength of 540 nm.

In FIG. 5, a solid line indicates a designed refractive index value, and broken lines indicate a variation range of the refractive index of the actually formed film. As shown in FIG. 5, regarding the SiON film, it was found that the slope of the refractive index with respect to the flow rate in a range before 2.3 sccm is different from that in a range after 2.3 sccm and that the variation in the refractive index is large on the high refractive index side where the slope is large. The variation in the refractive index is about ±0.07 in an $O_2$ flow rate range of lower than 2.3 sccm and is about ±0.02 in an $O_2$ flow rate range of higher than 2.3 sccm. A phenomenon in which the variation in the refractive index of SiON is significantly large on a higher refractive index side than the range of 1.58 to 1.66 was found by the present inventors for the first time as a result of though investigation.

Through this test, it was found that SiON is used only for forming a layer having a relatively low refractive index of lower than 1.66. That is, SiON is preferable for forming a layer having a refractive index of lower than 1.66, lower than 1.61, or lower than 1.58.

Next, a niobium-silicon oxide film (NbSiO) which is optimum for forming a layer having a high refractive index will be described.

[Test 2]

NbSiO films having various refractive indices were formed on a Si substrate using a sputtering method.

During the film formation, a Si target and a Nb target were used, the Ar flow rate was fixed to 26 sccm, the $O_2$ flow rate was fixed to 5 sccm, the RF power on the Si target side was changed in a range of 120 W to 500 W, and the RF power on the Nb target side was changed in a range of 120 W to 500 W. The film forming rates of the respective targets were individually controlled such that the RF powers applied to the Nb target and the Si target (that is, the film forming rates of the respective targets) were relatively changed, respectively. As a result, NbSiO films having a refractive index n in a range of 1.6 to 2.2 were obtained. In the obtained refractive index range, the variation in the refractive index with respect to the $O_2$ flow rate was ±0.02. In addition, the extinction coefficient k of each of the obtained NbSiO films was lower than or equal to a measurement limit irrespective of the refractive index.

Theoretically, the refractive index of NbSiO can be obtained in a range of 1.46 (the refractive index of $SiO_2$) to 2.3 (the refractive index of $Nb_2O_5$) by changing the composition ratio thereof. However, actually, there is a lower limit in the film forming rate due to a plasma unstable region during sputtering. In addition, there is also an upper limit in the film forming rate from the viewpoint of controlling the film thickness. Due to the lower limit in the film forming rate, it is difficult to realize a refractive index of lower than 1.6. Due to the upper limit in the film forming rate, it is difficult to realize a refractive index of higher than 2.2.

This tendency is shown not only in NbSiO but also in other oxide films which are formed by co-sputtering, for example, NbAlO, TiAlO, SiTiO, ZrSiO, or TaSiO. In an oxide film including two metal elements or an oxide film including Si and a metal element, it is difficult to realize a refractive index of lower than 1.6.

Based on the results of Test 1 and Test 2 described above, the following can be seen that it is preferable that the layer having a relatively high refractive index is formed of an oxide film including Si and one metal element and the layer having a relatively low refractive index is formed of SiON.

Hereinafter, the results of investigating antireflection performance using a simulation regarding Example and Comparative Example of the antireflection film according to the present invention and various configurations thereof will be described.

EXAMPLES

Example

An antireflection film according to Example of the present invention in which a thin multi-layer film was formed of an silicon oxynitride film and an NbSiO film was formed, and an optical member including the antireflection film was prepared.

In addition, a unit lens was formed by polishing a lens glass material (S-LAH60; manufactured by Ohara Inc.), and a dielectric multi-layer film having an antireflection function was formed on one surface of the lens.

Next, the antireflection film according to Example of the present invention was formed on the other surface of the lens. First, a SiNbO film as a layer having a relatively high refractive index and a SiON film as a layer having a relatively low refractive index were formed in this order using a sputtering method on the other surface of the lens to form a thin multi-layer film. In the SiNbO film, the thickness was set as 70 nm, and the refractive index n was set as 1.735

(designed value) at a wavelength of 540 nm. In the SiON film, the thickness was set as 80 nm, and the refractive index n was set as 1.584 (designed value) at a wavelength of 540 nm.

Next, an aluminum film having a thickness of 50 nm was formed, and the lens was dipped in boiling distilled water for 3 minutes such that aluminum was modified into an alumina hydrate. As a result, a fine unevenness layer formed of the alumina hydrate was formed.

Each of the layers was formed under sputtering conditions which were set in consideration of the relationship between the film thickness and the sputtering time and the relationship between the oxygen flow rate and the refractive index of the oxinitride, the relationships being obtained in advance, and the sputtering conditions including the sputtering time, the oxygen flow rate, and the like for obtaining the thickness and the designed refractive index.

In this way, the antireflection film according to Example was prepared in which the thin multi-layer film, which was formed of the SiNbO film and the SiON film, and the fine unevenness layer were formed on the substrate.

Under the same conditions and in different production lots, plural antireflection films, that is, plural optical members including the substrate and the antireflection film were prepared.

As a result of investigating the reflectances of the respective optical members, a variation in reflectance between the optical members manufactured in different production lots was small.

Next, an anti-internal-reflection coating material (manufactured by Canon Chemicals Inc. (GT1000)) was applied to an edge surface of the lens to have a thickness of 5 μm. The unit lens was incorporated into a lens barrel, and thus a camera lens was completed. In all the lenses prepared in this way, a small amount of ghosting was stably observed.

Comparative Example

Next, an antireflection film according to Comparative Example in which a thin multi-layer film was formed of only silicon oxynitride (SiON) was formed, and an optical member including this antireflection film was prepared.

A unit lens was formed by polishing a lens glass material (S-LAH60). A dielectric multi-layer film having an antireflection function was formed on one surface of the lens.

Next, the antireflection film according to Comparative Example of the present invention was formed on the other surface of the lens. First, a first SiON film as a layer having a relatively high refractive index and a second SiON film as a layer having a relatively low refractive index were formed in this order using a sputtering method on the other surface of the lens. In the first SiON film, the thickness was set as 70 nm, and the refractive index n was set as 1.735 (designed value) at a wavelength of 540 nm. In the second SiON film, the thickness was set as 80 nm, and the refractive index n was set as 1.584 (designed value) at a wavelength of 540 nm.

Next, an aluminum film having a thickness of 50 nm was formed, and the lens was dipped in boiling distilled water for 3 minutes such that aluminum was modified into an alumina hydrate. As a result, a fine unevenness layer formed of the alumina hydrate was formed.

As in the case of Example, each of the layers was formed under sputtering conditions which were set in consideration of the relationship between the film thickness and the sputtering time and the relationship between the oxygen flow rate and the refractive index of the oxinitride, the relationships being obtained in advance, and the sputtering conditions including the sputtering time, the oxygen flow rate, and the like for obtaining the thickness and the designed refractive index.

In this way, the antireflection film according to Comparative Example was prepared in which the thin multi-layer film, which was formed of the first SiON film and the second SiON film, and the fine unevenness layer were formed on the substrate.

Under the same conditions and in different production lots, plural antireflection films, that is, plural optical members including the substrate and the antireflection film were prepared.

As a result of investigating the reflectances of the respective optical members, it was found that, although the optical members were prepared under the same conditions, the reflectances thereof varied greatly between the plural optical members.

Next, an anti-internal-reflection coating material (manufactured by Canon Chemicals Inc. (GT1000)) was applied to an edge surface of the lens to have a thickness of 5 μm. The unit lens was incorporated into a lens barrel, and thus a camera lens was completed. In a lens having a high reflectance, a large amount of ghosting was observed.

[Simulation] Regarding each of the antireflection films of the optical members according to Example and Comparative Example, the dependence of the reflectance on the wavelength in each of the refractive index variation ranges was simulated. The calculation of the multi-layer film was performed using a thin film calculation software "Essential Macleod" (manufactured by Sigmakoki Co., Ltd.).

In the simulation, it was assumed that S-LAH60 (manufactured by Ohara Inc.) was used as the substrate, and the refractive index $n_0$ was set as 1.839.

Figure 7:
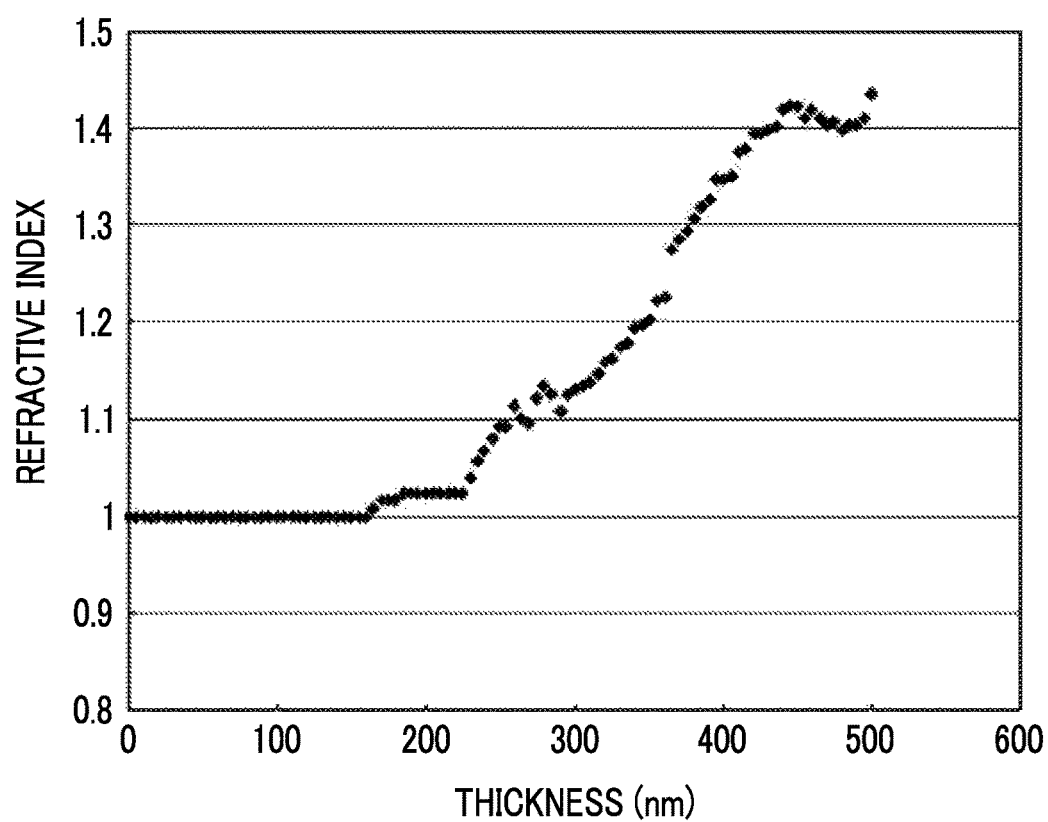
FIG. 7 is a diagram showing a change in the refractive index of a fine unevenness layer formed of an alumina hydrate in a thickness direction.

In addition, in order to obtain the refractive index of a boehmite layer which was obtained forming an aluminum film having a thickness of 50 nm and then performing a warm water treatment thereon, an aluminum film having a thickness of 50 nm was formed on a Si substrate under the same conditions, a warm water treatment was performed on the aluminum film to form an aluminum hydroxide film, and the refractive index of the aluminum hydroxide film was actually measured using an spectroscopic ellipsometer. The measured refractive index in the thickness direction was fitted to 100 layers having a thickness of 5 nm as shown in FIG. 7. In FIG. 7, the refractive index n of 1 was present on the air side, and a direction in which the thickness increases is a direction moving toward the substrate. This fitting results was used in the simulation.

Regarding the configuration of Example, the variation in the refractive index of NbSiO which was formed as a layer having a high refractive index was ±0.02 as described above. Therefore, the dependence of the reflectance of the antireflection film on the wavelength was simulated not only in a case where the designed refractive index was 1.735 but also in a case where the refractive index was 1.755 (=1.735+ 0.02) or 1.715 (=1.735−0.02).

Figure 8:
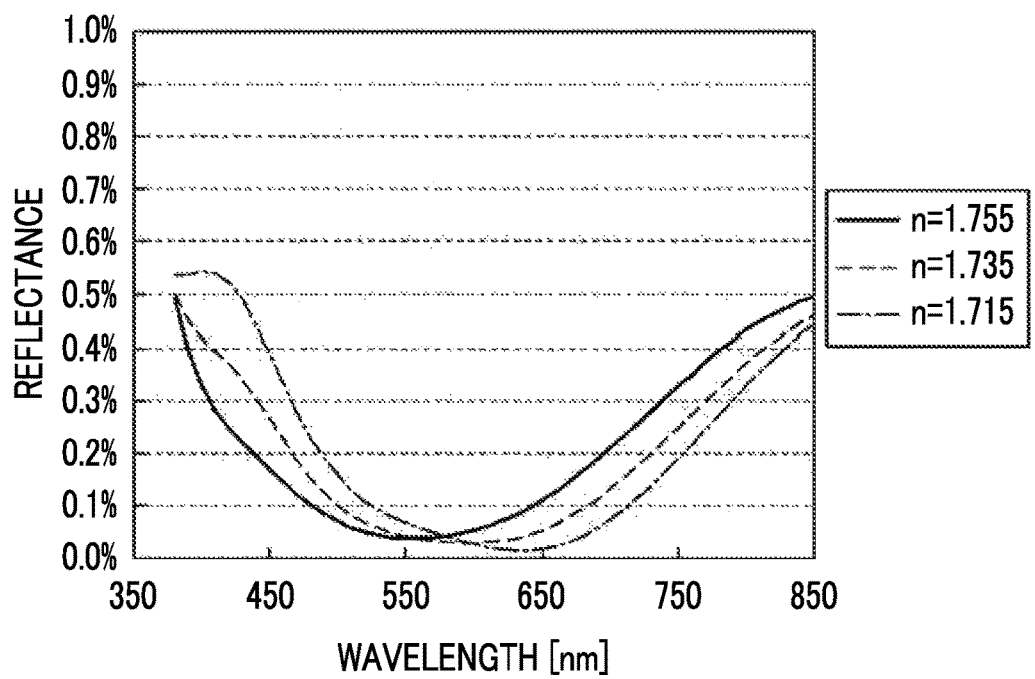
FIG. 8 is a diagram showing the results of a simulation regarding a variation in the reflectance of an antireflection film according to Example.

As shown in FIG. 8, in the refractive index variation range of NbSiO, a reflectance of 0.5% or lower was able to be realized over a wavelength region of 450 nm to 850 nm. With this configuration of the antireflection film according to the present invention, it is obvious that a stable quality can be realized and an optical member can be manufactured in a high yield.

On the other hand, in the configuration of Comparative Example, the refractive index of the first SiON layer which was formed as a layer having a high refractive index was higher than 1.66 and the variation thereof was ±0.07 as shown in FIG. 5. Therefore, the dependence of the reflectance of the antireflection film on the wavelength was simulated not only in a case where the refractive index of the first SiON layer was 1.735 but also in a case where the refractive index was 1.805 (=1.735+0.07) or 1.665 (=1.735−0.07).

Figure 9:
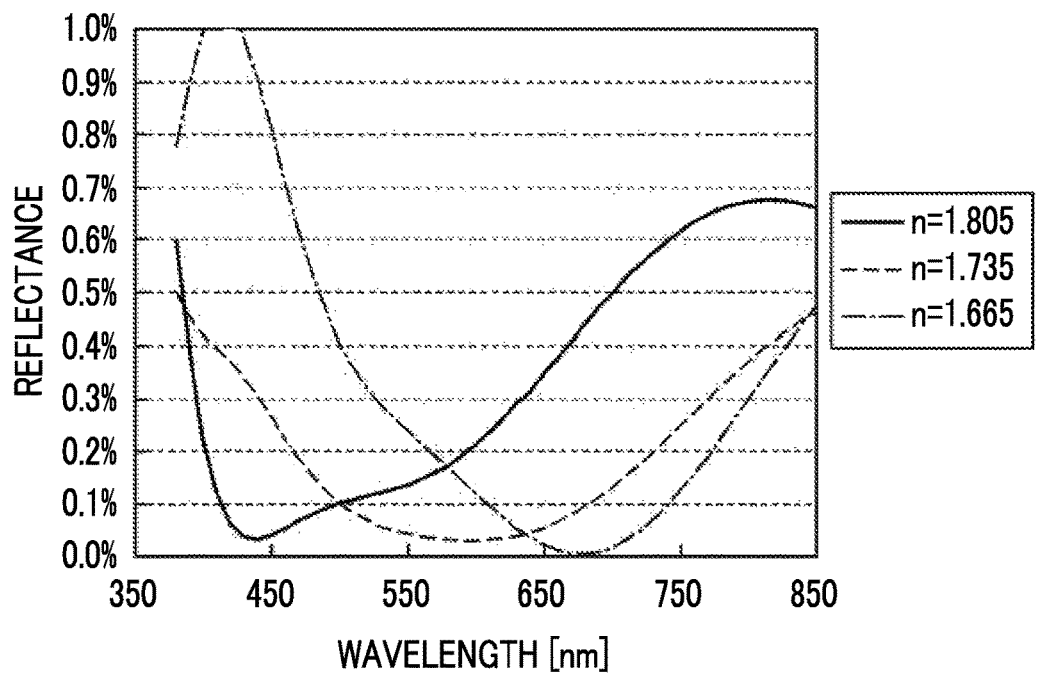
FIG. 9 is a diagram showing the results of a simulation regarding a variation in the reflectance of an antireflection film according to Comparative Example.

As shown in FIG. 9, when the refractive index of the first SiON layer was 1.665, the reflectance was higher than 0.5% at a wavelength of 500 nm or shorter and was higher than 1% at a wavelength of about 450 nm. In addition, when the refractive index of the first SiON layer was 1.805, the reflectance was higher than 0.5% at wavelength of longer than 700 nm. In a case where the reflectance increases, the amount of ghosting increases, and desired lens characteristics cannot be obtained. In this way, it is obvious that, in a case where the thin multi-layer film is formed of only SiON, the yield in which a lens having a stable quality is manufactured is low.

What is claimed is:

1. An antireflection film which is provided on a surface of a light-transmitting substrate, the antireflection film comprising a thin multi-layer film and a fine unevenness layer that are laminated in this order from the substrate side,
   wherein the thin multi-layer film includes multiple layers,
   wherein the fine unevenness layer has a structure in which an uneven structure having a shorter average pitch than a wavelength of used light is provided on a surface and in which a refractive index to the used light changes continuously depending on a continuous change in a space occupation of the uneven structure in a thickness direction of the thin multi-layer film,
   wherein the multiple layers include
      a layer having a refractive index which is higher than or equal to a refractive index n, which is formed of an oxide film of at least two metal elements or an oxide film of silicon and at least one metal element, and
      a layer having a refractive index which is lower than the refractive index n, which is formed of an oxynitride film,
   wherein the multiple layers do not include a layer having a refractive index which is higher than or equal to the refractive index n, that is formed of an oxynitride film, and
   wherein $1.58 \leq n \leq 1.66$.

2. The antireflection film according to claim 1,
   wherein the refractive index n is 1.61.

3. The antireflection film according to claim 1,
   wherein the layer having a refractive index which is lower than the refractive index n is a film formed of silicon oxynitride.

4. The antireflection film according to claim 2,
   wherein the layer having a refractive index which is lower than the refractive index n is a film formed of silicon oxynitride.

5. The antireflection film according to claim 1,
   wherein the layer having a refractive index which is higher than or equal to a refractive index n is a niobium-silicon oxide film.

6. The antireflection film according to claim 2,
   wherein the layer having a refractive index which is higher than or equal to a refractive index n is a niobium-silicon oxide film.

7. The antireflection film according to claim 3,
   wherein the layer having a refractive index which is higher than or equal to a refractive index n is a niobium-silicon oxide film.

8. The antireflection film according to claim 4,
   wherein the layer having a refractive index which is higher than or equal to a refractive index n is a niobium-silicon oxide film.

9. An optical member comprising the antireflection film according to claim 1 on a surface of a light-transmitting substrate.

* * * * *